United States Patent
Okamuro et al.

(10) Patent No.: US 7,046,176 B2
(45) Date of Patent: May 16, 2006

(54) ROTARY ENCODER

(75) Inventors: Takashi Okamuro, Tokyo (JP);
Hirokazu Sakuma, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 68 days.

(21) Appl. No.: 10/497,589

(22) PCT Filed: Apr. 11, 2003

(86) PCT No.: PCT/JP03/04641

§ 371 (c)(1),
(2), (4) Date: Jun. 3, 2004

(87) PCT Pub. No.: WO2004/092683

PCT Pub. Date: Oct. 28, 2004

(65) Prior Publication Data

US 2006/0033643 A1    Feb. 16, 2006

(51) Int. Cl.
*H03M 1/48* (2006.01)
(52) U.S. Cl. .................. 341/115; 341/15; 341/116; 250/231.14
(58) Field of Classification Search ................ 341/115, 341/15, 13, 116
See application file for complete search history.

(56) References Cited

U.S. PATENT DOCUMENTS

| | | | |
|---|---|---|---|
| 4,572,951 A * | 2/1986 | Toda et al. .................. 341/15 |
| 4,780,703 A * | 10/1988 | Ishida et al. ................. 341/13 |
| 4,782,329 A * | 11/1988 | Iijima et al. ................. 341/15 |
| 5,677,686 A | 10/1997 | Kachi et al. |
| 5,691,646 A * | 11/1997 | Sasaki ......................... 341/15 |
| 5,786,781 A * | 7/1998 | Taniguchi et al. ........... 341/115 |
| 6,384,405 B1 * | 5/2002 | Kenjo et al. .................. 341/11 |
| 6,555,809 B1 * | 4/2003 | Kenjo et al. .................. 341/11 |

FOREIGN PATENT DOCUMENTS

| | | |
|---|---|---|
| DE | 689 15 814 T2 | 9/1994 |
| DE | 195 02 339 C2 | 10/1995 |
| DE | 696 13 867 T2 | 10/2001 |
| DE | 698 20 330 T2 | 10/2004 |
| EP | 1 046 884 A1 | 10/2000 |
| EP | 1 116 936 A1 | 7/2001 |
| JP | 7-218288 A | 8/1995 |
| JP | 09 042 995 A | 2/1997 |
| JP | 9-42995 A | 2/1997 |
| JP | 11-325972 A | 11/1999 |
| JP | 2003/035569 A | 2/2003 |
| JP | 2003-35569 A | 2/2003 |

* cited by examiner

*Primary Examiner*—Peguy Jeanpierre
*Assistant Examiner*—Lam T. Mai
(74) *Attorney, Agent, or Firm*—Sughrue Mion, PLLC (57) ABSTRACT

A rotary type encoder is provided with a signal generating portion 2 for generating a sine wave signal of N periods for each revolution in accordance with the rotation of the shaft 4 of a motor; a calculation means for obtaining the rotation angle of the shaft 4 based on the sine wave signal; an EEPROM 37 being arranged in a manner that the error value of the rotation angle for one revolution of the shaft 4 thus measured is divided in relation with the N periods to set a plurality of first angle regions i, the angle region almost at the center of the angle region i is divided into plural regions to set second angle regions j, and an error value corresponding to the angle at almost the center of each of the angle regions j is stored therein in correspondence with the rotation angle; and a correction means for reading the error value stored in the EEPROM 37 in correspondence with the rotation angle to correct the rotation angle.

4 Claims, 6 Drawing Sheets

ANGULAR ERROR DATA TABLE

| ADDRESS θ | DATA (8BITS) ε (θ) |
|---|---|
| 000 | B (0, 0) |
| 001 | B (0, 1) |
| ⋮ | ⋮ |
| 01f | B (0, 1f) |
| 020 | B (1, 0) |
| 021 | B (1, 1) |
| ⋮ | ⋮ |
| 3ff | B (1f, 1f) |

ROTARY ENCODER

TECHNICAL FIELD

The present invention intends in a rotary type encoder to correct an angular error generated due to a core deviation between the shaft center of a rotation shaft and the center of a rotary disk thereby to improve detection accuracy.

BACKGROUND ART

The conventional rotary type encoder will be explained with reference to JP-A-11-325972. According to this publication, the rotary type encoder employs a method of correcting an absolute angular error generated due to the core fluctuation between a rotary disk and a rotation shaft to which the rotary disk is fixed thereby to improve the positional detection accuracy of an encoder apparatus. That is, the method includes a core fluctuation amount detection process of detecting an amount of the core fluctuation between the rotary disk and the rotation shaft to which the rotary disk is fixed, an absolute angular error determining process of determining an absolute angular error from the amount of the core fluctuation, a correction value determining process of determining a correction value for correcting the absolute angular error, and a positional data correcting process of adding the correction value to the an absolute angular position data outputted from the encoder apparatus to correct the absolute angular position data.

According to such a rotary type encoder, it is possible to obtain the absolute angular position data with a high accuracy from which error due to the core fluctuation is eliminated.

However, in the conventional technique, when error data divided into many regions is stored in a storage element in order to secure the accuracy of the absolute angular error, the size of the storage element becomes large according to the increase of the storage capacity and so the size of the rotary type encoder becomes large. In particular, according to the increase of an N frequency component of one revolution, the number of the error data increases, and hence there arises a problem that the storage capacity increases and so the size of the storage element becomes large.

DISCLOSURE OF THE INVENTION

The present invention intends to obviate the aforesaid problem and an object of the invention is to reduce an information amount of error data thereby to reduce a capacity of a storage element and provide a rotary type encoder with a high accuracy.

The rotary type encoder according to the invention is characterized by including:

signal generating means for generating a sine wave signal of N periods for each revolution in accordance with rotation of a shaft;

calculation means for obtaining a rotation angle of the shaft based on the sine wave signal;

storage means being arranged in a manner that an error value of the rotation angle for one revolution of the shaft thus measured is divided in relation with the N periods to set a plurality of first angle regions, an angle region almost at a center of the first angle region is divided into plural regions to set second angle regions, and the error value corresponding to an angle at almost a center of the second angle region is stored therein in correspondence with the rotation angle; and first correction means for reading the error value stored in the storage means in correspondence with the rotation angle and correcting the rotation angle.

According to the rotary type encoder thus configured, the storage means is arranged in a manner that the error value of the rotation angle for one revolution of the shaft thus measured is divided in relation with the N periods to set a plurality of the first angle regions, an angle region almost at the center of the first angle region is divided into plural regions to set second angle regions, and the error value corresponding to an angle at almost the center of the second angle region is stored therein in correspondence with the rotation angle; and the first correction means reads the error value stored in the storage means in correspondence with the rotation angle and corrects the rotation angle, so that the storage capacity of the storage means can be made small.

The encoder according to another invention is characterized in that the storage means includes a first storage element which holds storage contents and is capable of writing the storage contents even when a power supply thereof is cut off, and a second storage element which writes storage contents read from the first storage element when the power supply thereof is turned on and extinguishes the storage contents when the power supply thereof is cut off.

According to the rotary type encoder thus configured, since the angular error value corresponding to the rotation angle is stored in the second storage element which extinguishes the storage contents when the power supply thereof is cut off, the accessing time to the second storage element can be reduced. Thus, the first correction means can perform the processing at a high speed.

The encoder according to still another invention is characterized in that, instead of the first correction means, second correction means is provided which subjects the error values at two proximate second angular regions read from the storage means to linear interpolation in correspondence with the rotation angle thereby to obtain an approximate error value and corrects the rotation angle based on the approximate error value.

According to the rotary type encoder thus configured, since the rotation angle is corrected based on the approximate error value, the accuracy of the correction of the rotation angle can be improved.

The encoder according to still another invention is characterized by including determining means for determine whether a difference between the proximate angular error values is equal to or more than a predetermined value, and execution means for executing the second correction means only when the difference is larger than the predetermined value.

According to the rotary type encoder thus configured, the accuracy of the correction of the rotation angle can be improved while improving the high speed property.

BEST MODE FOR CARRYING OUT THE INVENTION

Embodiment 1

Figure 1:
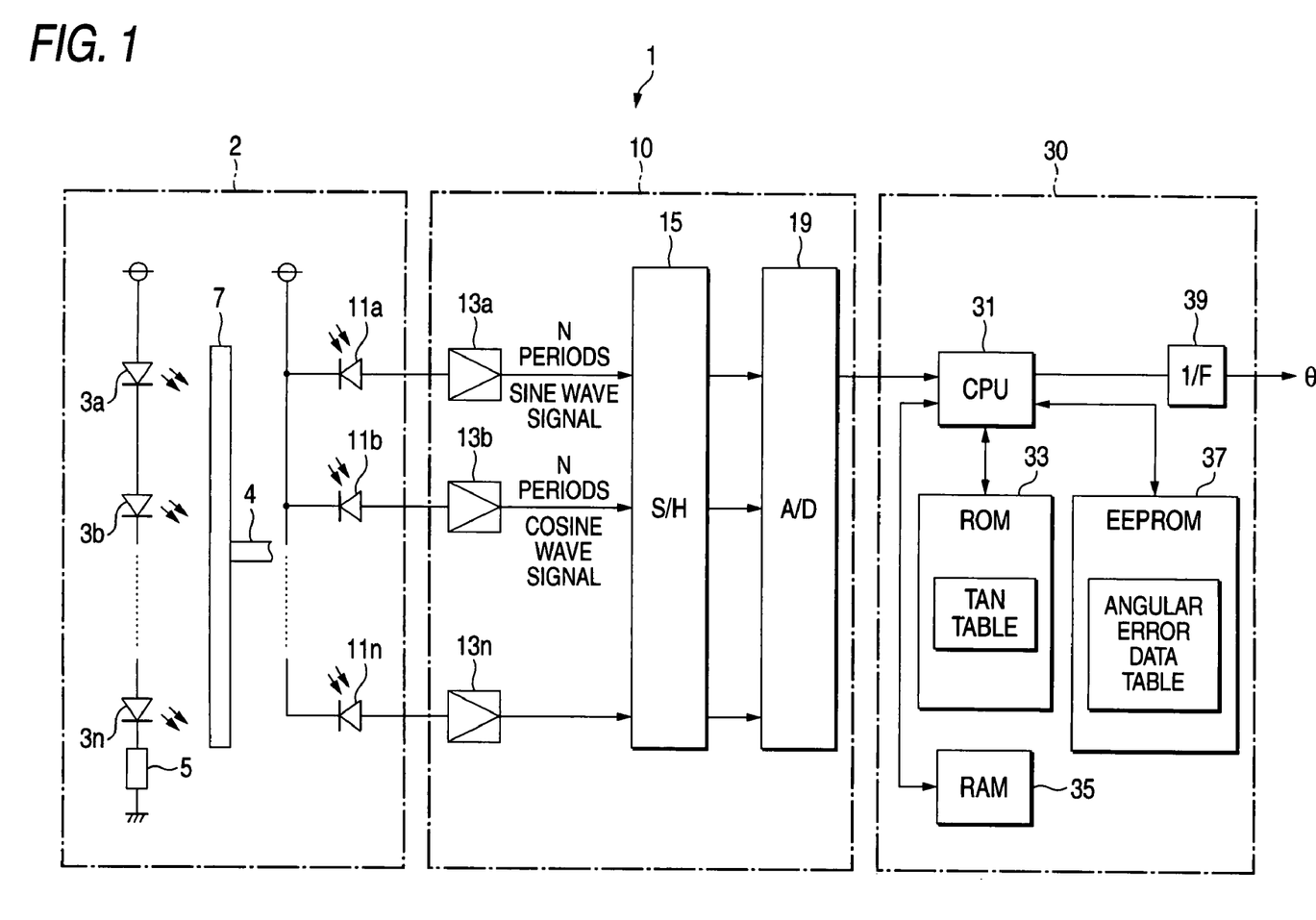
FIG. 1 is a diagram showing the entire configuration of a rotary type encoder according to the embodiment of the invention.
Figure 2:
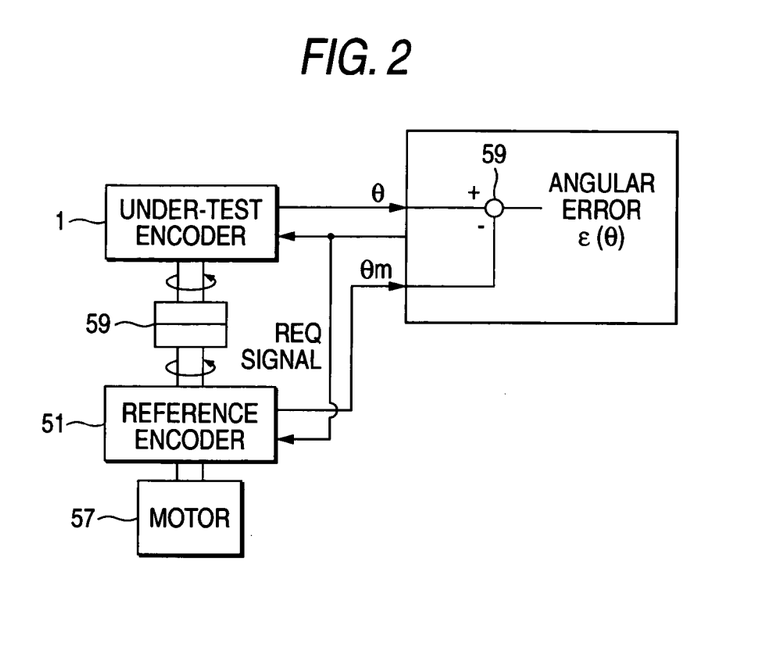
FIG. 2 is a diagram showing the configuration of a measuring apparatus for measuring an angular error of the rotary type encoder shown in FIG. 1.
Figure 3:
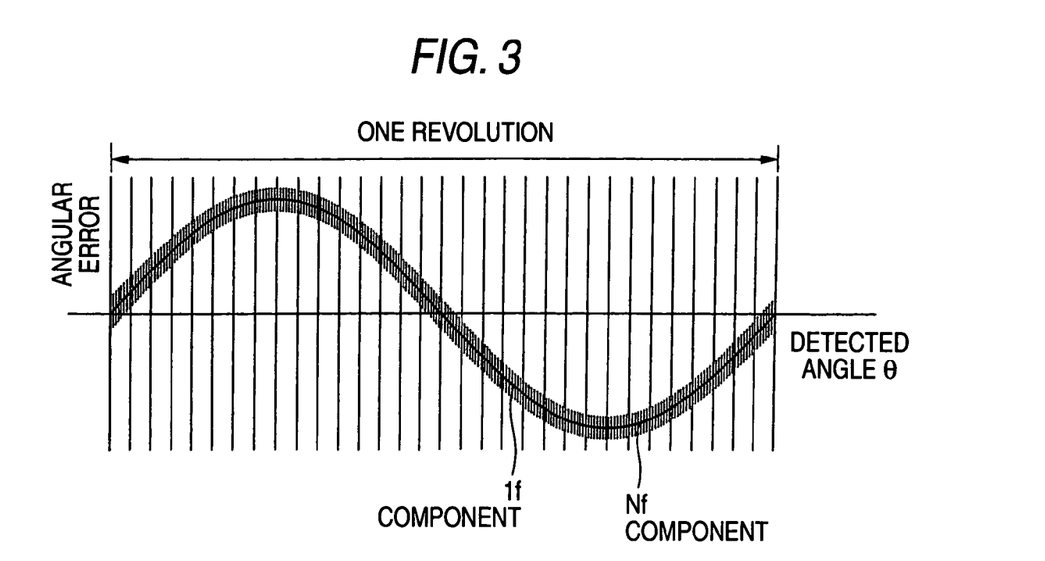
FIG. 3 is a diagram showing an angular error curve for one revolution of the rotary type encoder shown in FIG. 1.
Figure 4:
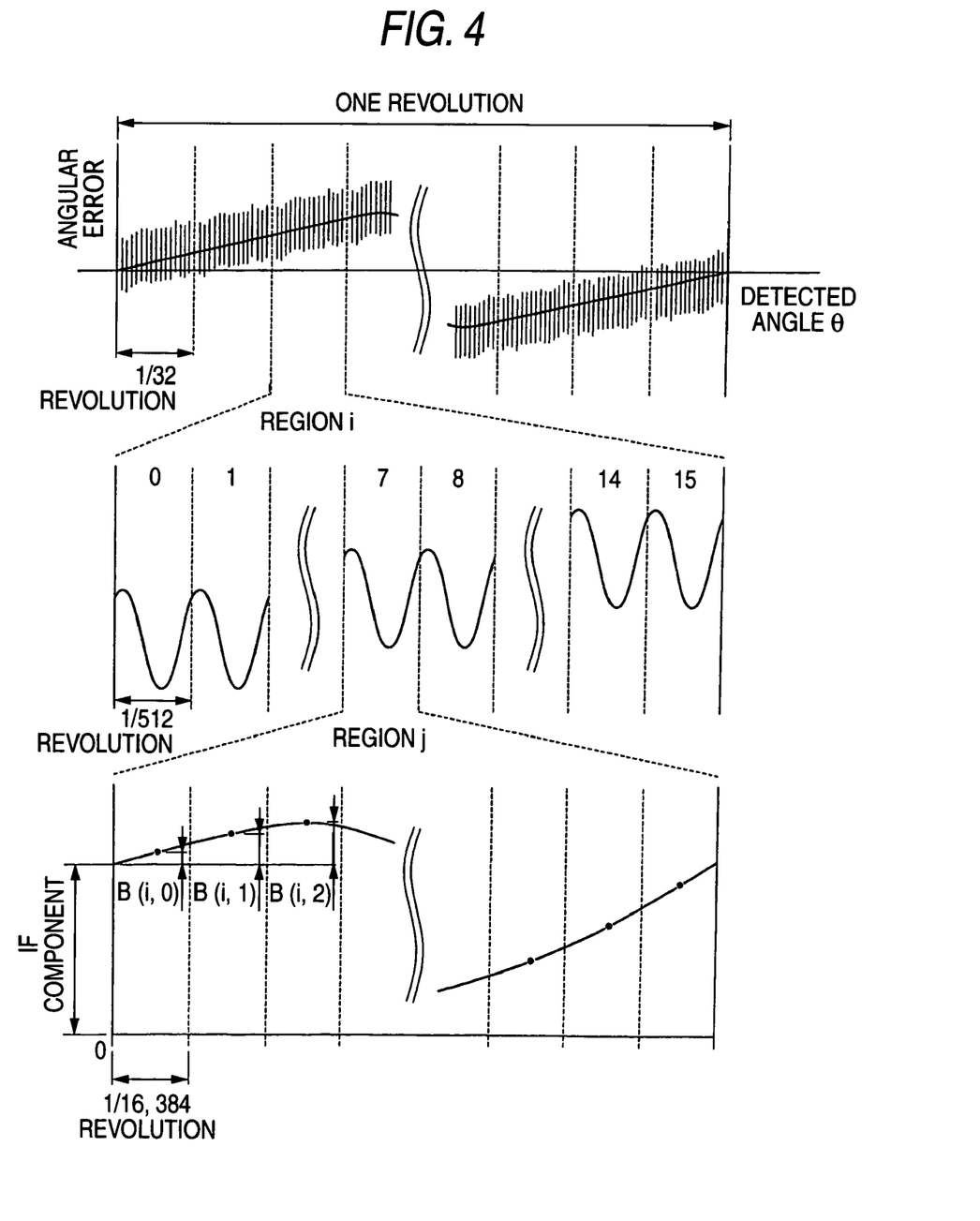
FIG. 4 is a partially enlarged diagram of the angular error curve shown in FIG. 3.

An embodiment of the invention will be explained with reference to FIG. 1. FIG. 1 is a diagram showing the entire configuration of a rotary type encoder according to the embodiment of the invention. FIG. 2 is a diagram showing the configuration of a measuring apparatus for measuring an angular error of the rotary type encoder shown in FIG. 1. FIG. 3 is a diagram showing an angular error curve for one revolution of the rotary type encoder shown in FIG. 1. FIG. 4 is a partially enlarged diagram of the angular error curve shown in FIG. 2.

In FIG. 1, the rotary type encoder 1 is configured by a signal generating portion 2 serving as a signal generating means for generating a sinusoidal wave signal and a cosine wave signal in accordance with the rotation of the shaft 4 of a motor, a converting processing portion 10 for converting the analog sinusoidal wave signal and the analog cosine wave signal generated from the signal generating portion 2 into a digital signal, and a calculation portion 30 serving as a calculation means for calculating and detecting the rotation angle of the shaft 4 of the motor based on the digital signal and an angular error table.

The signal generating portion 2 is configured by light emitting diodes 3a to 3n for generating light with directivity when a current is flown therein through a resistor 5, a circular plate 7 which is fixed to the shaft 4 of the motor and has a pattern formed by a transmissive portion for transmitting the light and a non-transmissive portion for shielding the light, and light receiving diodes 11a to 11n for receiving the light through the circular plate 7 and respectively flowing currents according to light amounts thus received.

The converting processing portion 10 is configured by amplifiers 13a to 13n for respectively amplifying the currents flowing through the light receiving diodes 11a to 11n to generate sine wave signals and cosine wave signals each having 512 f component, for example, as sine wave signals and cosine wave signals each having N periods per one revolution of the shaft 4; a sample and hold circuit 15 for sampling the sine wave signals of the N periods in synchronism with a request signal and holding the voltages of the sine wave signals; and an analog-to-digital (A/D) converter 19 for converting analog outputs of the sample and hold circuit into a digital signal.

The cosine signal is obtained in a manner that a light passing through a second slit, which electric angle is deviated by 90 degrees with respect to a first slit formed at the circular plate 7 for the sine wave signal, is detected by the light receiving diodes 1a to 11n and subjected to the photoelectric conversion.

The calculation portion 30 is configured by a CPU 31 coupled to the output of the A/D converter 19, a ROM 33 for reading storage contents thereof in response to the sine wave signal and the cosine wave signal serving as address signals, an EEPROM 37 serving as a first storage element which holds storage contents thereof even when a power supply thereof is cut off and in which error data is written and stored, and a RAM 35 serving as a second storage element which temporarily stores the error data read out from the EEPROM 37 and extinguishes the storage contents thereof when a power supply thereof is cut off.

In this respect, since the error data is values inherent to the rotary type encoder 1, the EEPROM 37 is employed as an element in which the data can be electrically written at the time of manufacturing the rotary type encoder 1.

A value obtained by multiplying $\tan^{-1}(Xs/Xc)$ by a suitable constant number in accordance with the addresses designated by the sine wave signal and the cosine wave signal, that is, sin data Xs and cos data Xc is converted into a binary number and stored into the ROM 33.

The angular error of the rotary type encoder 1 is measured in the following manner and stored in the EEPROM 37. First, the explanation will be made as to the reason why the angular error occurs in the rotary type encoder 1.

<Reason why Angular Error Occurs>

The light generated from the light emitting diodes 3a to 3n is received by the light receiving diodes 11a to 11n through the circular plate 7. Since the light generated from the light emitting diodes 3a to 3n contains oblique rays, diffracted light is generated when the light generated from the light emitting diodes 3a to 3n passes through the circular plate 7. Such the oblique rays and the diffracted light changes in its amount reaching the light receiving diodes 11a to 11n due to slits formed between the circular plate 7 and the tip portions of the light receiving diodes 11a to 11n.

Such the slits are formed such that the accuracy for fixing the circular plate 7 to the motor shaft, that is, an amount of fluctuation per one revolution in the axial direction at the tip portion of the circular plate 7 becomes a predetermined accuracy. Thus, since the tip portion of the circular plate 7 slightly fluctuates according to the rotation angle of the shaft 4 of the motor during one revolution, each of the oblique rays and the diffracted light also gradually changes with one period per one revolution. Therefore, a signal of Nf component generated from the light receiving diodes 11a to 11n, which is outputted through the circular plate 7 at which a pattern of the Nf component is formed, also changes at the Nf frequency in a sine wave manner with one period per one revolution as shown in FIG. 3.

Further, in FIG. 3, as another frequency component of the error of the rotation angle, a 1f component is also generated which changes in a sine wave manner with one period per one revolution due to the fluctuation of the circular plate 7. Then, when taking the error of the rotation angle totally, the Nf component is superimposed on the 1f component.

<Measuring of Angular Error>

In FIG. 2, a motor 57 rotates a reference encoder 51 and an under-test encoder 1 with a resolution of $2^{18}$ which is coupled through a coupling 59 to the shaft of the reference encoder 51 having been calibrated. Further, a subtracter 51 obtains an angular error $\epsilon(\theta)$ which is a difference between the reference angular signal $\theta m$ of the reference encoder 1 and the detected rotation angle value $\theta$ of the under-test encoder 51 in response to the generation of the request signal thereby to obtain the angular errors $\epsilon(\theta)$ for one revolution of the under-test encoder 1 as shown in FIG. 3.

<Preparation of Angular Error Table>

In FIG. 4, in a 512 component in which 512 waves are generated per one revolution of the rotation type encoder 1, a region to be divided is a region obtained by dividing one revolution, i.e., 360 degrees by 32, that is, a rough region i serving as a first region. A value of a 1/512 region at the center value within the 1/32 region is set as a representative value of the Nf component. This is to make the value thus set correspond to 512 periods.

Further, the 1/512 region at the center of the 1/32 region is further divided by 32 to obtain a fine region j serving as a second region which is 1/16,384 region with respect to the original signal. In this respect, the 1/512 region at the center is divided because the 1/512 region at the center is equal to a mean value of the 1/512 regions.

When a center value of the 1/16,384 region is obtained and the center value is continued, a signal almost similar to the original Nf signal can be obtained. In this respect, the number of divisions of the 1/512 region is set in a manner that the continuity can almost be obtained in the regions obtained after the division by taking the amplitude of the 1/512 region into consideration.

Figure 5:
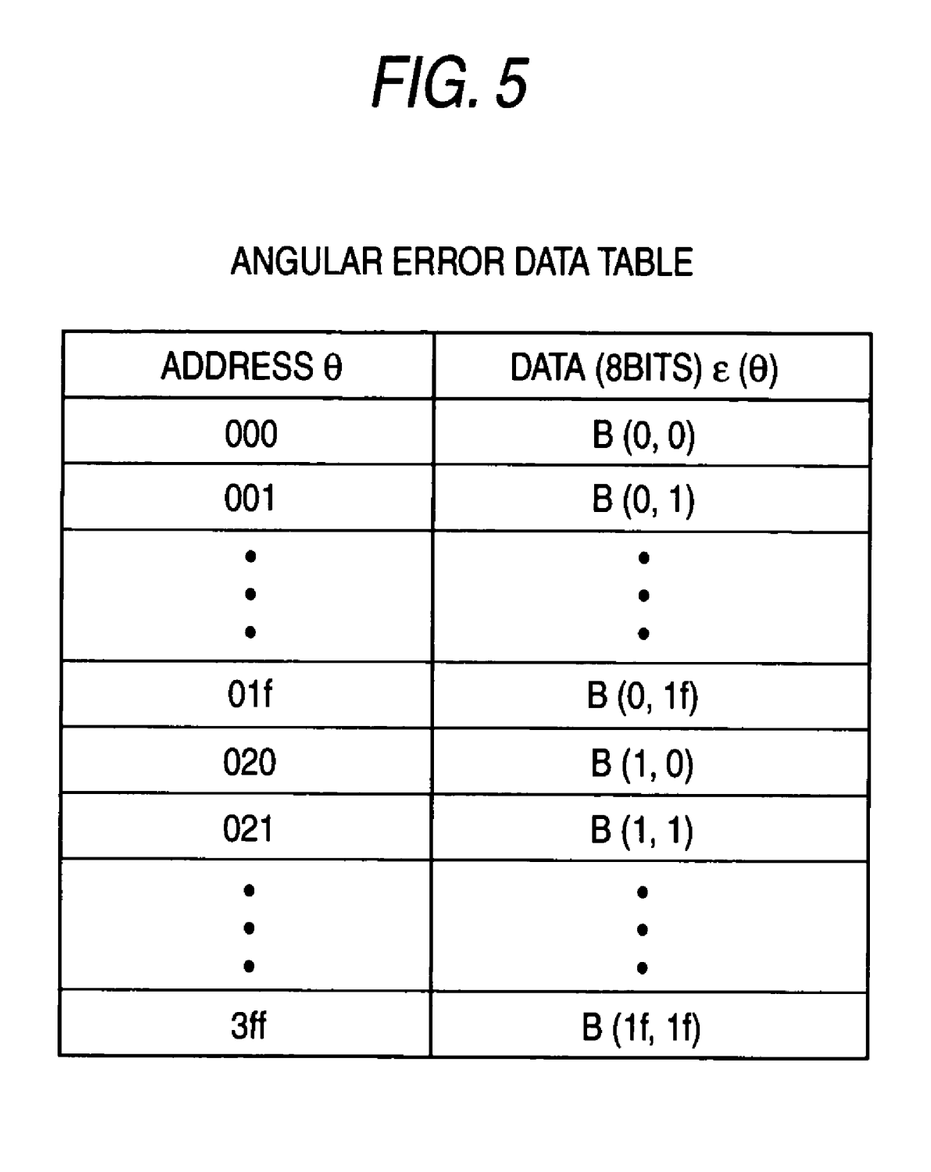
FIG. 5 is a diagram showing an angular error data table prepared based on FIG. 4.

The angular error data table is prepared as shown in FIG. 5 in a manner that as to an angular error $\epsilon$ ($\theta$) corresponding to the center portion B(i, j) of each of the 1/16,384 regions, a detected rotation angle $\theta$ of the rotary type encoder 1 is used as an address and an angular error $\epsilon$ ($\theta$) corresponding to an address is stored. The angular error data table is stored in the EEPROM 37. Thus, the storage capacity of the EEPROM 37 becomes 32×32=1,024 bytes as to the 512 f component.

The operation of the rotary type encoder 1 configured in the aforesaid manner will be explained with reference to FIGS. 1 to 5.

Figure 6:
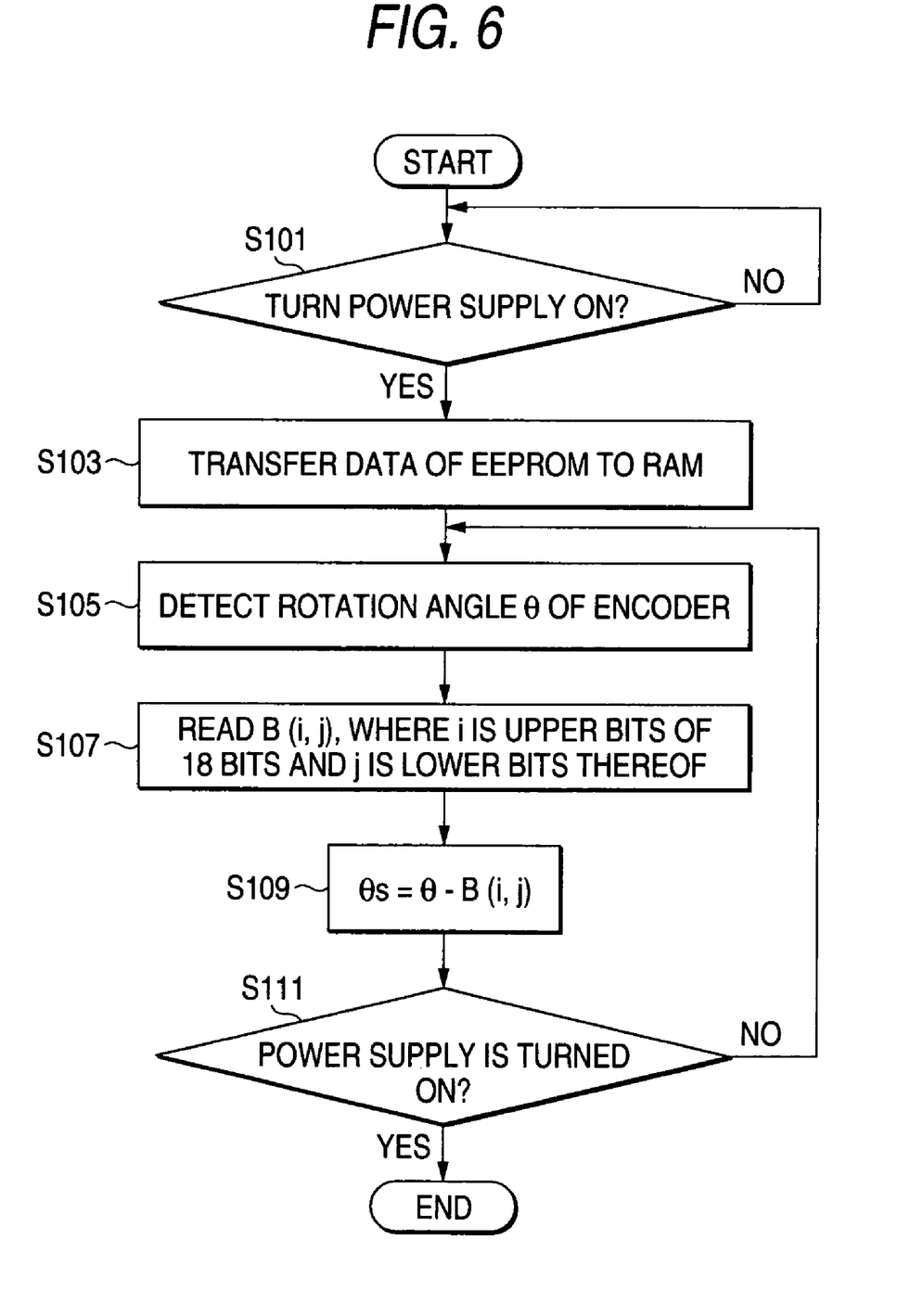
FIG. 6 is a flowchart showing the operation of the rotary type encoder in FIG. 1.

When the power supply for the rotary type encoder 1 is turned on (step S101), the CPU 31, as an initial processing, reads the angular error correction data B(i, j) (where, i=0 to 32, j=0 to 32) stored in the EEPROM 37 and transfers the data to the RAM 35 (step S103). This is because an access time of the RAM 35 is shorter than that of the EEPROM 37.

The light receiving diodes 11a to 11n receive the light from the light emitting diodes 3a to 3n through the circular plate 7 and generate the sine wave signals and the cosine wave signals of the N periods. The sine wave signals and the cosine wave signals are amplified by the amplifiers 13a to 13n and sampled and held by the sample and hold circuit 15. The A/D converter 19 converts the analog sine wave signals and the analog cosine wave signals into the digital signal. The CPU 31 obtains the digital signal and the detected angle $\theta$ read from the tan table (step S105).

Figure 7:
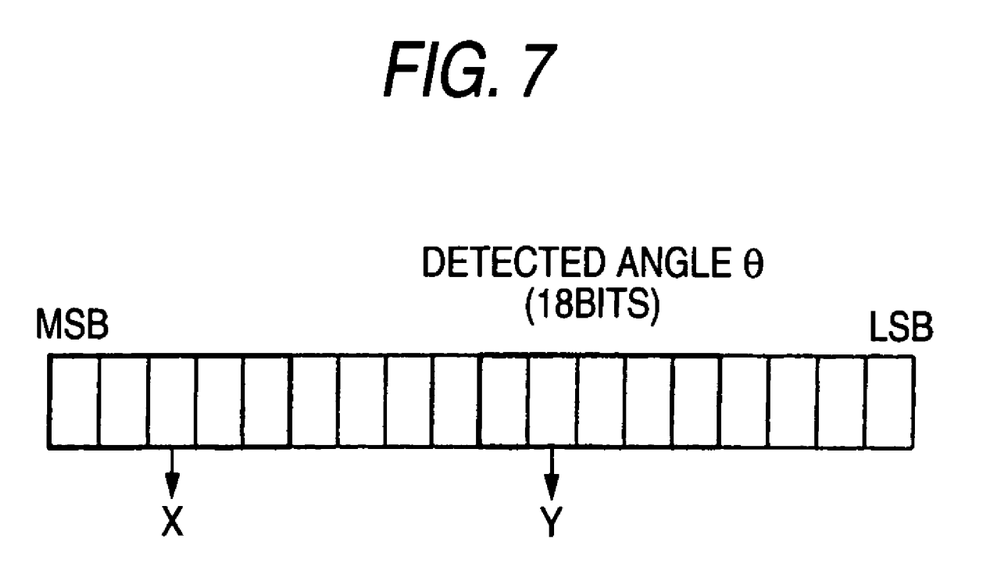
FIG. 7 is a diagram showing the data structure of an angle detection signal according to the rotary type encoder shown in FIG. 1.

It is assumed that the upper 5 bits of the detected angle $\delta$ of the encoder 1 is x and the upper 5 bits of the lower 9 bit data is y. The B(i, j) stored in the RAM 35, that is, the error data corresponding to the detected angle $\theta$ is read out by using the x and y of the detected angle $\theta$ as an address. Supposing that the angle of the 512 f component after the angular error correction is a corrected angle $\theta$s, it is expressed as $\theta s=\theta-B(i, j)$ (step S107). That is, the first correction means is executed.

According to the embodiment, there is provided with the signal processing portion 2 for generating the sine wave signal of the N periods for each revolution in accordance with the rotation of the shaft 4 of the motor; the calculation portion 30 for obtaining and detecting the rotation angle of the shaft 4 based on the sine wave signal; the EEPROM 37 being arranged in a manner that the sine wave signal for one revolution of the shaft 4 thus measured is divided in relation with the N periods to set a plurality of the angle regions i, the angle region almost at the center of the angle region i is divided into the plural regions to set the angle regions j, and the angular error value corresponding to the angle at almost the center of each of the angle regions j is stored in the angular error data table provided therein in correspondence with the rotation angle; and the first correction means for reading the angular error value stored in the EEPROM 37 in correspondence with the rotation angle of the shaft 4 to correct the rotation angle of the shaft 4. Thus, it is possible to obtain the detected angles with a high accuracy while reducing the storage capacity of the EEPROM 37.

Incidentally, in the aforesaid embodiment, the detected angle is corrected so as to be $\theta s=\theta-B(i, j)$ in the case of reading the error data corresponding to the detected angle $\theta$ and setting the angle of the 512 f component after the angular error correction is $\theta$ s. Alternatively, the correction may be performed in the following manner in order to improve the accuracy of the correction.

That is, instead of performing the step 107, such a second correction means may be employed in which the CPU 31 subjects the angular error values at the two proximate second angular regions j read from the RAM 35 to the linear interpolation in correspondence with the rotation angle $\theta$ of the shaft 4 of the motor thereby to obtain an approximate error value and corrects the rotation angle of the shaft 4 of the motor based on the approximate error value.

Further, alternatively, the CPU 31 may determine whether a difference between the afore said proximate angular error values is equal to or more than a predetermined value (determining means) and may execute the second correction means only when it is determined that the difference is larger than the predetermined value (execution means).

INDUSTRIAL APPLICABILITY

As described above, the invention is suitable for use in the rotary type encoder.

The invention claimed is:

1. A rotary type encoder comprising:
   signal generating means for generating a sine wave signal of N periods for each revolution in accordance with rotation of a shaft;
   calculation means for obtaining a rotation angle of the shaft based on the sine wave signal;
   storage means for storing an error value in relation with the rotation angle, the error value corresponding to an almost center angle of a second angle region, the second angle region set by dividing a substantially center angle region of a plurality of first angle regions into a plurality of parts, the plurality of first angle regions obtained by dividing the error value into a plurality of parts in relation with the N periods, the error value corresponding to one revolution of the shaft; and
   first correction means for reading the error value stored in the storage means in correspondence with the rotation angle and correcting the rotation angle.

2. The rotary type encoder according to claim 1, wherein the storage means includes
   a first storage element which holds storage contents and is capable of writing the storage contents even when a power supply thereof is cut off, and
   a second storage element which writes storage contents read from the first storage element when the power supply thereof is turned on and extinguishes the storage contents when the power supply thereof is cut off.

3. A rotary type encoder comprising:
   signal generating means for generating a sine wave signal of N periods for each revolution in accordance with rotation of a shaft;

calculation means for obtaining a rotation angle of the shaft based on the sine wave signal;

storage means for storing an error value in relation with the rotation angle, the error value corresponding to an almost center angle of a second angle region, the second angle region set by dividing a substantially center angle region of a plurality of first angle regions into a plurality of parts, the plurality of first angle regions obtained by dividing the error value into a plurality of parts in relation with the N periods, the error value corresponding to one revolution of the shaft; and second correction means for reading the error values at two of the second angle regions that are disposed adjacently from the storage means and correcting the rotation angle based on an approximate error value obtained by linear interpolating the error values in correspondence with the rotation angle.

4. The rotary type encoder according to claim 3, further comprising:

determining means for determine whether a difference between error values is equal to or more than a predetermined value; and execution means for executing the second correction means only when the difference is larger than the predetermined value.

* * * * *